US 6,570,791 B2

(12) United States Patent
Roohparvar et al.

(10) Patent No.: US 6,570,791 B2
(45) Date of Patent: May 27, 2003

(54) FLASH MEMORY WITH DDRAM INTERFACE

(75) Inventors: Frankie Fariborz Roohparvar, Milpitas, CA (US); Kevin C. Widmer, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/943,330

(22) Filed: Aug. 30, 2001

(65) Prior Publication Data
US 2003/0043624 A1 Mar. 6, 2003

(51) Int. Cl.[7] .............................................. G11C 16/04
(52) U.S. Cl. .............. 365/185.33; 365/233; 365/189.05
(58) Field of Search ..................... 365/185.33, 233, 365/189.05, 230.06, 230.08, 230.09, 185.08; 711/162

(56) References Cited

U.S. PATENT DOCUMENTS 5,903,496 A * 5/1999 Kendall et al. ........ 365/185.12
6,043,694 A 3/2000 Dortu
6,100,733 A 8/2000 Dortu et al.
6,130,853 A 10/2000 Wang et al.
6,134,180 A * 10/2000 Kim et al. ............. 365/230.02
6,154,419 A 11/2000 Shakkarwar
6,166,970 A 12/2000 Yun
6,201,760 B1 3/2001 Yun et al.
6,215,710 B1 4/2001 Han et al.
6,215,722 B1 4/2001 Park
6,215,726 B1 * 4/2001 Kubo ........................ 327/141
6,233,199 B1 5/2001 Ryan
6,310,814 B1 10/2001 Hampel et al.
6,327,216 B1 12/2001 Ryan
6,336,174 B1 * 1/2002 Li et al. ..................... 365/228
6,343,046 B1 * 1/2002 Matsui ....................... 365/190

* cited by examiner

Primary Examiner—David Lam
(74) Attorney, Agent, or Firm—Leffert Jay & Polglaze, P.A.

(57) ABSTRACT

A flash memory has an interface corresponding to a DDR DRAM. The memory samples commands and addresses on a rising edge of a clock signal. The read and write data are provided on both the rising edge and the falling edge of the clock signal.

17 Claims, 5 Drawing Sheets

FLASH MEMORY WITH DDRAM INTERFACE

FIELD OF THE INVENTION

The present invention relates generally to memory devices and in particular the present invention relates to a non-volatile memory interface.

BACKGROUND OF THE INVENTION

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Asynchronous DRAM (SDRAM) is a type of DRAM that can run at much higher clock speeds than conventional DRAM memory. SDRAM synchronizes itself with a CPU's bus. SDRAM's can be accessed quickly, but are volatile. Many computer systems are designed to operate using SDRAM, but would benefit from non-volatile memory.

Advances in DRAM interfaces has resulted in double data rate (DDR) DRAMs. These memory devices provide data communication that is synchronized to both rising and falling edges of a clock signal. While DDR DRAMs provide for fast data communications, the data is stored in a volatile manner.

For the reasons stated above, and for other reasons stated below which will become apparent to those skilled in the art upon reading and understanding the present specification, there is a need in the art for a non-volatile memory that can communicate at fast DRAM speeds.

SUMMARY OF THE INVENTION

The above-mentioned problems with non-volatile memories and other problems are addressed by the present invention and will be understood by reading and studying the following specification.

In one embodiment, a flash memory comprises an array of non-volatile memory cells, data connections, and output circuitry to provide output data on the data connections on rising and falling edges of a clock signal.

In another embodiment, a flash memory comprises an array of non-volatile memory cells, data connections, a clock signal connection to receive a clock signal, and output circuitry to provide output data on the data connections on rising and falling edges of the clock signal. Input circuitry is provided to receive input data on the data connections on rising and falling edges of the clock signal.

A method of reading a flash memory comprises providing a read command, providing memory cell addresses, reading first and second data words from non-volatile memory cells, outputting the first data word on a rising edge of a clock signal, and outputting the second data word on the falling edge of the clock signal.

Another method of reading a flash memory comprises reading first and second data words from non-volatile memory cells, outputting the first data word on a rising edge of a clock signal, and outputting the second data word on the falling edge of the clock signal.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention provides a non-volatile memory device that is compatible with double data rate dynamic random access memory (DDR DRAM). DDR DRAMs generally provide output data that is synchronized to both transitions of a clock signal.

Figure 1:
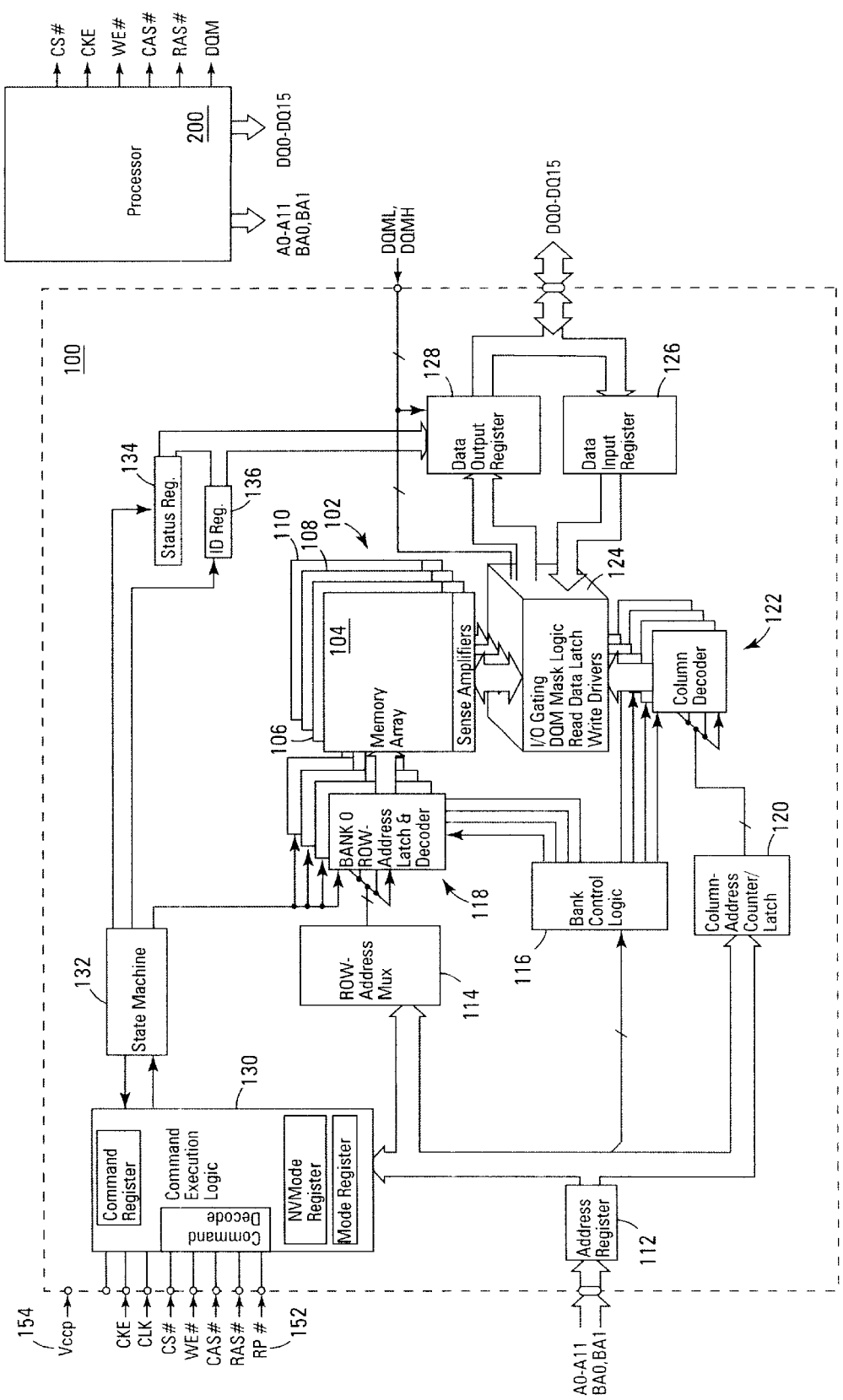
FIG. 1 is a block diagram of an embodiment of a flash DDR memory of the present invention.

Referring to FIG. 1, a block diagram of a flash memory according to one embodiment of the present invention is described. The memory device includes an array of non-volatile floating gate memory cells. As known to those in the art, the non-volatile memory cells store a charge on the floating gate. The floating gate charge changes the threshold voltage of the memory cell. In traditional flash memory cells, a current-sensing scheme was employed to read the memory cells. The present invention uses a voltage-sensing scheme to read the non-volatile memory cells. Possible voltage-sensing schemes are described in U.S. patent applications "Differential Sensing in a Memory Using Two Cycle Pre-Charge" Ser. No. 09/648,706, filed Aug. 25, 2000; "Bit Line Pre-Charge in a Memory" Ser. No. 09/648,701, filed Aug. 25, 2000; "Adjustable Pre-Charge in a Memory" Ser. No. 09/648,722, filed Aug. 25, 2000; and "Differential Sensing in a Memory" Ser. No. 09/648,723, filed Aug. 25, 2000, each incorporated herein by reference.

The DDR flash memory of the present invention can be arranged in numerous different architectures, and FIG. 1 is merely a representative architecture of the present invention. Memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output gating, data mask logic, read data latch circuitry and write driver circuitry. Circuit 124 also includes precharge circuitry used to read the non-volatile memory cells, as explained below.

Data is input through data input registers 126 and output through data output registers 128. Command execution logic 130 is provided to control the basic operations of the memory device. A state machine 132 is also provided to control specific operations performed on the memory arrays and cells. A status register 134 and an identification register 136 can also be provided to output data. The command circuit 130 and/or state machine 132 can be generally referred to as control circuitry to control read, write, erase and other memory operations. The illustrated memory architecture uses a common read and write path. Other embodiments can include separate the read and write paths to provide for the power requirements of writing to the flash cells.

Figure 2:
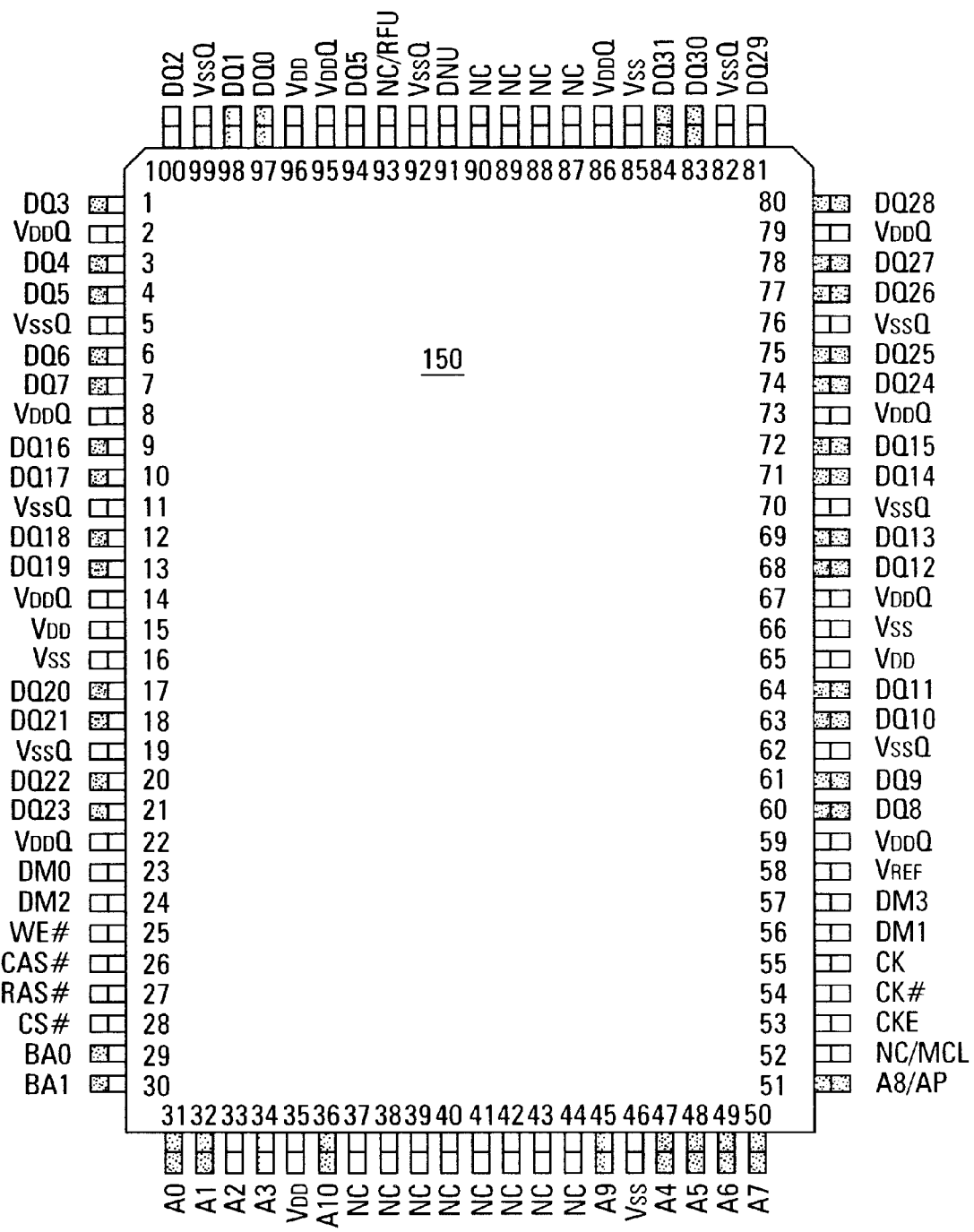
FIG. 2 illustrates one interconnect configuration of the memory of FIG. 1.

FIG. 2 illustrates an interconnect pin assignment of one embodiment of the present invention. The memory package 150 has an interconnect configuration that is substantially similar to available DDR DRAM packages. Two optional interconnects can be provided in an embodiment of the present invention; RP# 152 and Vccp 154. Although the present invention shares interconnect labels that are appear the same as DDR DRAM's, the function of the signals provided on the interconnects are described herein and should not be equated to DDR DRAM's unless set forth herein.

The CK and Ck# inputs are differential clock signals, and all address and control signals are sampled on the crossing of the positive edge of CK and negative edge of CK#. Output data is references at the crossing of CK and CK#. A clock enable, CKE, input is provided, and a chip select, CS#, enables a command decoder circuit. RAS#, CAS# and WE# signals are used to input commands. Data mask inputs, DM0–DM3, can be used to perform masking operations on memory data. Bank address inputs, BA0–BA1, and address inputs, A0–A10, identify memory array locations. The number of bank address inputs and address inputs is selected based on the size of the array, and the present invention is not limited to the address inputs described. Data input/output connections, DQ, are provided for bi-directional data communication. A DQ strobe connection can be provided which provides a signal that is edge aligned with read data and center aligned with write data. Various power supply connections are also provided. The VCC connection provides a power supply such as 3V. A ground connection is provided through the Vss connection. Another optional voltage is provided on the VCCP connection 154. The VCCP connection can be tied externally to VCC, and sources current during device initialization, write and erase operations. That is, writing or erasing to the memory device can be performed with a VCC voltage. The flash memory can include an RP# connection to place the device in a deep power-down mode when LOW, and is held HIGH during all other modes of operation.

The present invention uses an initialization operation to load volatile latches used during memory operation. The volatile latches are loaded using data read from non-volatile memory cells, or registers. The non-volatile memory cells, or registers, can be distributed around the memory device, or consolidated in a small array.

The flash memory provides a DDR interface that processes two data words per clock cycle. Read accesses to the memory can be burst oriented. That is, memory accesses start at a selected location and continue for a programmed number of locations in a programmed sequence. Read accesses begin with the registration of an ACTIVE command, followed by a READ command. The address bits registered coincident with the ACTIVE command are used to select the bank and row to be accessed. The address bits registered coincident with the READ command are used to select the starting column location and bank for the burst access.

An ACTIVE command is used to open (or activate) a row in a particular array bank for a subsequent access. The value on the BA0, BA1 inputs selects the bank, and the address provided on inputs A0–A10 selects the row. The READ command is used to initiate a burst read access to an active row. The value on the BA0, BA1 inputs select the bank, and the address provided on inputs A0–A7 selects the starting column location.

A WRITE command is used to initiate a single-location write access on an active row. A WRITE command is preceded by a WRITE SETUP command. The value on the BA0, BA1 inputs select the bank, and the address provided on inputs A0–A7 selects a column location. Input data appearing on the DQs is written to the memory array, subject to the DQM input logic level appearing coincident with the data.

Before any READ or WRITE commands can be issued to a bank within the DDR flash memory, a row in that bank is "opened." This is accomplished via the ACTIVE command (defined by CS#, WE#, RAS#, CAS#), which selects both the bank and the row to be activated. A single-location WRITE is initiated with a WRITE command. The starting column and bank addresses are provided with the WRITE command.

Figure 3:
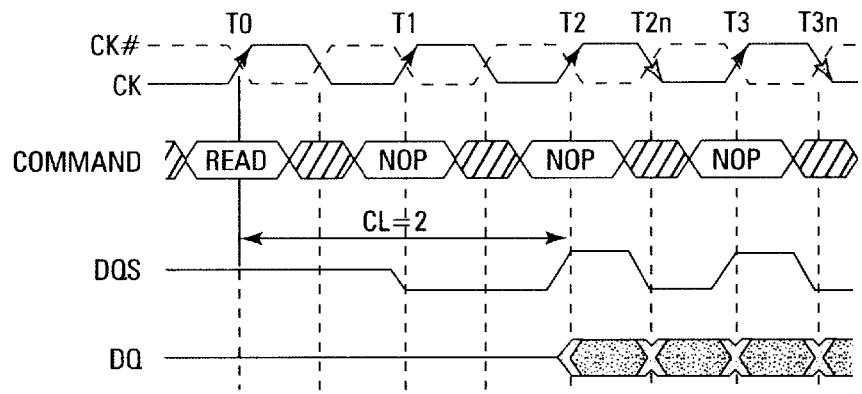
FIG. 3 is a timing diagram of a read operation of the memory of FIG. 1.

Referring to FIG. 3, a timing diagram of a read operation is described. The current invention provides read data timing that corresponds with existing DDR DRAM specifications. After a row has been accessed using an active command (not shown), a READ command is issued at time T0. Following a clock latency (2 in this example), the read data is output on the DQ lines. The output data is provided on each transition of the clock signal. That is, four words of the illustrated burst are output in two clock cycles.

Figure 4:
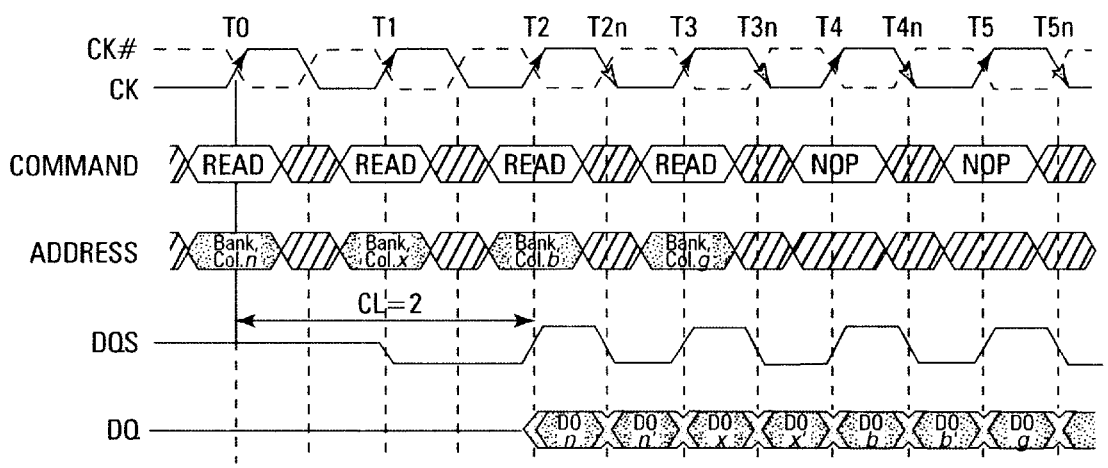
FIG. 4 is a timing diagram of another read operation of the memory of FIG. 1.

Referring to FIG. 4, a timing diagram of consecutive read operations is described. The first read operation is performed as explained above. A second READ command is provided at time T2 with a new column start address. Following a clock latency (2 in this example), the first read data is output on the DQ lines. At time T4, the second read burst is provided on the DQ connections.

Figure 5:
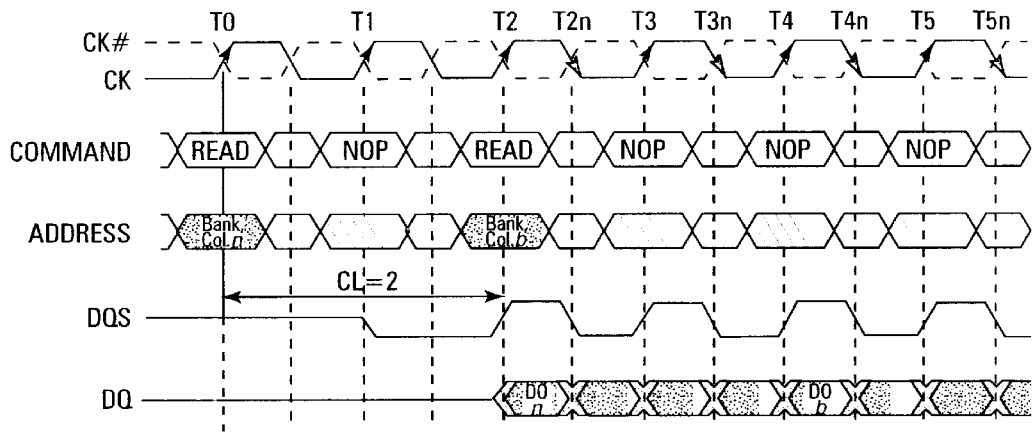
FIG. 5 is a timing diagram of another read operation of the memory of FIG. 1.

Referring to FIG. 5, a timing diagram of consecutive read operations is described. The first read operation is initiated as explained above. On clock cycles T1, T2 and T3, additional READ commands are issued to the memory. Following a twocycle clock latency, the first read data is output on the DQ lines. The output data burst is interrupted after one clock cycle to provide data from the next read operation. As such, two words are output from each accessed column.

Figure 6:
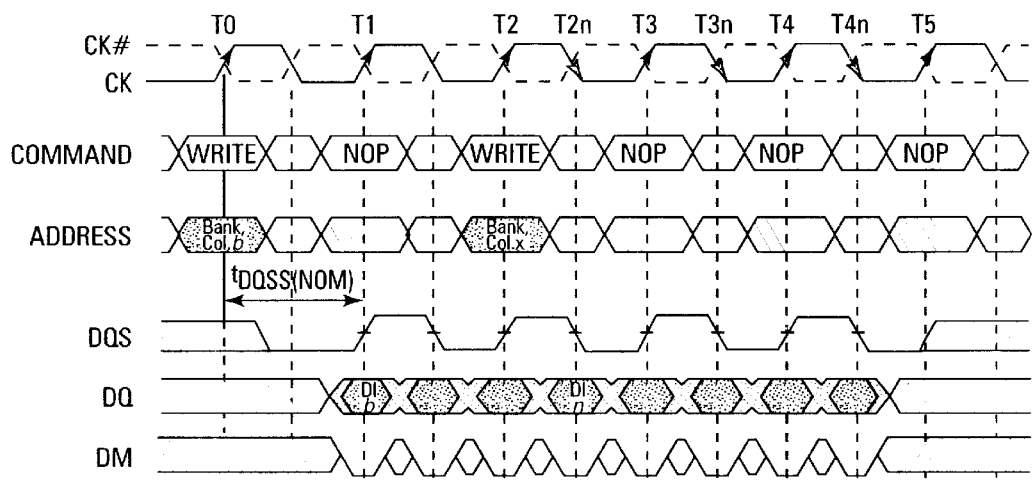
FIG. 6 is a timing diagram of a write operation of the memory of FIG. 1.

A timing diagram of a write operation is illustrated in FIG. 6. The present invention uses non-volatile memory cells, as explained above, for data storage. The process used to write data to the array, therefore, requires more time than writing to dynamic memory cells. The present invention allows data to be written to the memory using a DDR timing, as illustrated. That is, two words are provided on the DQ during each clock cycle. The memory stores the data in a volatile buffer until the data is written to the array. It will be appreciated that limits on the volume of write data may be required to insure that all received data is written to the array.

The present invention uses a data-sensing scheme that increases the speed of read operations and reduces current consumption compared to conventional flash memory devices. That is, conventional flash memories use a current sensing technique that compares a current conducted by a memory cell to a reference current. This sensing technique is slower than a DRAM differential voltage-sensing scheme. Further, to read numerous columns of memory cells simultaneously, conventional current sensing techniques consume a relatively large current.

An embodiment of the present invention uses a voltage sensing technique to read the non-volatile memory cells. In one embodiment, differential digit lines are precharged to different voltage levels prior to accessing a memory cell. For example, an active digit line that is coupled to a read memory cell can be pre-charged to a voltage that is greater than a complementary digit line. If the read memory cell is unprogrammed (conducts current when read), the active digit line is quickly discharged below the complementary digit line voltage. If the read memory cell is programmed (does not conduct current when read), the active digit line voltage remains above the complementary digit line voltage. A differential voltage sensing circuit can be used to detect and amplify the digit line voltages. Further, pre-charging the digit lines to a differential level is not limited to a specific technique, but can be accomplished using charge sharing, a bias circuit or the like.

Figure 7:
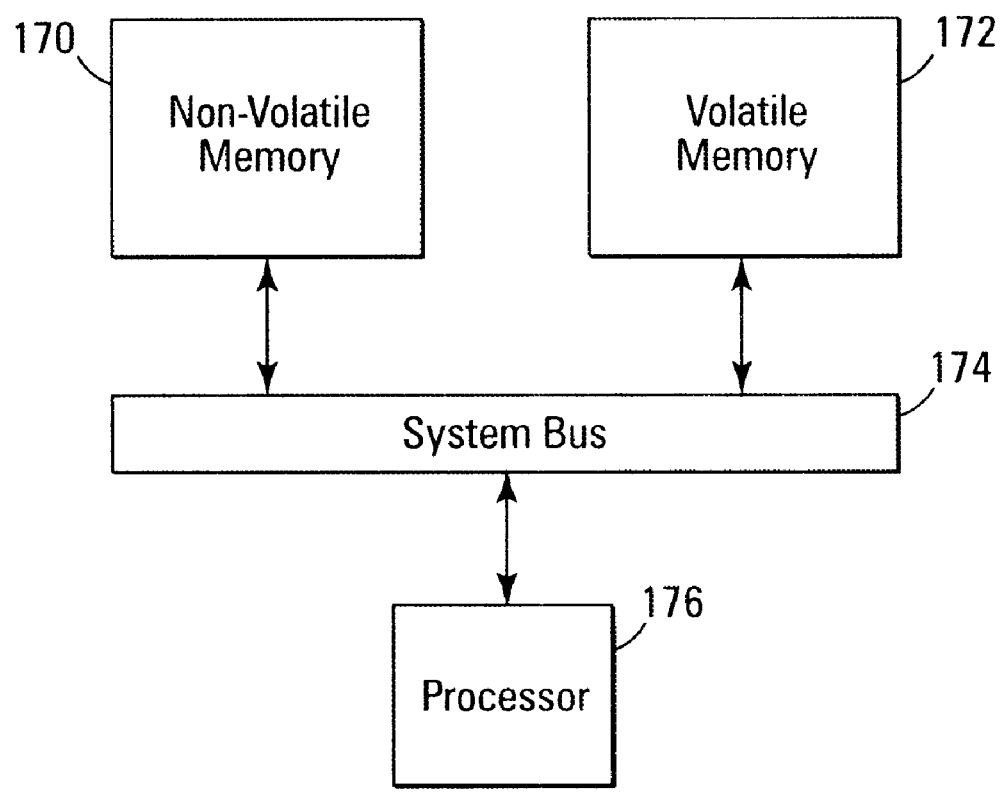
FIG. 7 is a block diagram of another embodiment of the present invention.

The present invention allows both volatile and non-volatile memory devices to use a unified communication bus as shown in FIG. 7. As such, a separate non-volatile bus is eliminated. Both non-volatile 170 and volatile 172 memories use the volatile memory bus 174, which is in turn coupled to a processor 176. Further, both memories 170 and 172 respond to common command signals, although the command signals may be interpreted differently by the memories 170 and 172.

CONCLUSION

A flash memory has been described that has an interface corresponding to a DDR DRAM. The memory samples commands and addresses on a rising edge of a clock signal. The read and write data are provided on both the rising edge and the falling edge of the clock signal.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A flash memory comprising:
   an array of non-volatile memory cells;
   sense amplifier circuitry coupled to the array, wherein the sense amplifier circuitry detects a differential voltage from the array of non-volatile memory cells;
   data connections; and
   output circuitry to provide output data on the data connections on rising and falling edges of a clock signal.

2. The flash memory of claim 1 wherein the flash memory comprises an interconnect configuration that is compatible with a double data rate dynamic random access memory (DDR DRAM).

3. The flash memory of claim 1 further comprising input circuitry to receive input data on the data connection on rising and falling edges of a clock signal.

4. A flash memory comprising:
   an array of non-volatile memory cells;
   sense amplifier circuitry coupled to the array, wherein the sense amplifier circuitry detects a differential voltage from the array of non-volatile memory cells;
   data connections;
   a clock signal connection to receive a clock signal;
   output circuitry to provide output data on the data connections on rising and falling edges of the clock signal; and
   input circuitry to receive input data on the data connections on rising and falling edges of the clock signal.

5. The flash memory of claim 4 wherein the flash memory comprises an interconnect configuration that is compatible with a double data rate synchronous dynamic random access memory (DDR SDRAM).

6. A flash memory comprising:
   an array of non-volatile memory cells, wherein the array comprises bit lines couplable to the non-volatile memory cells;
   sense amplifier circuitry coupled to the bit lines, wherein the sense amplifier circuitry detects a differential voltage between the bit lines;
   pre-charge circuitry coupled to pre-charge the bit lines to first and second voltage levels to provide an initial differential voltage prior to sensing a memory cell;
   data connections;
   a clock signal connection to receive a clock signal; and
   output circuitry to provide output data on the data connection on rising and falling edges of the clock signal.

7. The flash memory of claim 6 further comprising input circuitry to receive input data on the data connection on rising and falling edges of the clock signal.

8. A flash memory comprising:
   an interconnect configuration that is compatible with a double data rate synchronous dynamic random access memory (DDR SDRAM);
   an array of non-volatile memory cells;
   data connections;
   a clock signal connection to receive a clock signal;
   control circuitry coupled to the array to provide two data access operations per clock cycle; and
   control signals comprising a data strobe signal (DQS) connection, address signal connections, row address strobe (RAS) connection, column address strobe (CAS) connection, write enable (WE) connection, and a chip select (CS) connection.

9. A method of reading a flash memory comprising:
   providing a read command;
   providing memory cell addresses;
   reading first and second data words from non-volatile memory cells;
   outputting the first data word on a rising edge of a clock signal; and
   outputting the second data word on the falling edge of the clock signal.

10. The method of claim 9 wherein the flash memory comprises an interconnect configuration that is compatible with a double data rate synchronous dynamic random access memory (DDR SDRAM).

11. The method of claim 9 wherein reading the first and second data words from the non-volatile memory cells comprises detecting a program state of the non-volatile memory cells using a voltage comparator circuit.

12. The method of claim 11 wherein the non-volatile memory cells are floating gate memory cells and the comparator circuit detects a voltage of a word line coupled to non-volatile memory cells.

13. A method of reading a flash memory comprising:
 detecting a first and a second differential voltage from non-volatile memory cells with sense amplifier circuitry;
 reading first and second data words from the non-volatile memory cells in response to the first and second differential voltages;
 outputting the first data word on a rising edge of a clock signal; and
 outputting the second data word on the falling edge of the clock signal.

14. A processing system comprising:
 a processor; and
 a double data rate flash memory coupled to the processor comprising:
  an array of non-volatile memory cells;
  a clock signal connection to receive a clock signal; and
  control circuitry coupled to the array to provide two data access operations per clock cycle.

15. The processing system of claim 14 wherein the flash memory comprises an interconnect configuration that is compatible with a double data rate synchronous dynamic random access memory (DDR SDRAM).

16. A processing system comprising:
 a processor;
 a single communication bus coupled to the processor;
 a volatile memory device coupled to the single communication bus; and
 a double data rate flash memory coupled to the single communication bus comprising,
  an array of non-volatile memory cells,
  a clock signal connection to receive a clock signal, and
  control circuitry coupled to the array to provide two data access operations per clock cycle.

17. The processing system of claim 16 wherein the volatile memory device and the double data rate flash memory both respond to common command signals provided on the single communication bus.

* * * * *